United States Patent
Wu et al.

(10) Patent No.: US 10,608,089 B2
(45) Date of Patent: Mar. 31, 2020

(54) THIN FILM TRANSISTOR AND METHOD OF FABRICATING SAME, ARRAY SUBSTRATE AND DISPLAY DEVICE

(71) Applicants: BOE TECHNOLOGY GROUP CO., LTD., Beijing (CN); ORDOS YUANSHENG OPTOELECTRONICS CO., LTD., Inner Mongolia (CN)

(72) Inventors: Xinguo Wu, Beijing (CN); Fengguo Wang, Beijing (CN); Dawei Shi, Beijing (CN); Hong Liu, Beijing (CN); Zifeng Wang, Beijing (CN); Feng Li, Beijing (CN); Bo Ma, Beijing (CN); Zhixuan Guo, Beijing (CN); Yuanbo Li, Beijing (CN); Cenhong Duan, Beijing (CN); Jing Zhao, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 0 days.

(21) Appl. No.: 16/122,339

(22) Filed: Sep. 5, 2018

(65) Prior Publication Data
US 2019/0123156 A1  Apr. 25, 2019

(30) Foreign Application Priority Data
Oct. 23, 2017  (CN) .......................... 2017 1 0995939

(51) Int. Cl.
*H01L 29/417* (2006.01)
*G02F 1/1362* (2006.01)
(Continued)

(52) U.S. Cl.
CPC .. *H01L 29/41733* (2013.01); *G02F 1/136227* (2013.01); *H01L 27/1259* (2013.01);
(Continued)

(58) Field of Classification Search
CPC .................................................. G02F 2201/40
See application file for complete search history.

(56) References Cited

U.S. PATENT DOCUMENTS

2010/0133539 A1* 6/2010 Kang ...................... H01L 27/12
257/59
2016/0018935 A1* 1/2016 Wei ........................ G06F 3/044
345/173
(Continued)

FOREIGN PATENT DOCUMENTS

CN    106531692 A    3/2017

OTHER PUBLICATIONS

First Office Action dated Nov. 15, 2019 corresponding to Chinese application No. 201710995939.X.

*Primary Examiner* — Nduka E Ojeh
(74) *Attorney, Agent, or Firm* — Nath, Goldberg & Meyer; Joshua B. Goldberg; Stephanie Majkut

(57) ABSTRACT

The present application provides a thin film transistor, an array substrate, a display device and a method of fabricating a thin film transistor. According to embodiments of the present application, the thin film transistor includes: a substrate; a first source/drain electrode on the substrate; an active layer at a side of the first source/drain electrode facing away from the substrate; and a second source/drain electrode at a side of the active layer facing away from the first source/drain electrode. The first source/drain electrode and the second source/drain electrode are electrically connected to the active layer independently.

12 Claims, 4 Drawing Sheets

(51) Int. Cl.
*H01L 29/786* (2006.01)
*H01L 27/12* (2006.01)
*G02F 1/1368* (2006.01)
*G02F 1/1343* (2006.01)

(52) U.S. Cl.
CPC .. *H01L 29/78618* (2013.01); *H01L 29/78633* (2013.01); *G02F 1/1368* (2013.01); *G02F 1/134363* (2013.01); *G02F 1/136286* (2013.01); *G02F 2201/40* (2013.01); *H01L 27/124* (2013.01)

(56) References Cited

U.S. PATENT DOCUMENTS

| | | |
|---|---|---|
| 2017/0090229 A1 | 3/2017 | Imai et al. |
| 2017/0315392 A1* | 11/2017 | Noh ...................... G02F 1/1368 |
| 2018/0122832 A1* | 5/2018 | Lee ................... G02F 1/133345 |

* cited by examiner

THIN FILM TRANSISTOR AND METHOD OF FABRICATING SAME, ARRAY SUBSTRATE AND DISPLAY DEVICE

CROSS-REFERENCE TO RELATED APPLICATION

This application claims priority to Chinese Patent Application No. 201710995939.X, filed on Oct. 23, 2017, the contents of which are incorporated herein by reference in the entirety.

TECHNICAL FIELD

The present application relates to the field of display technology, and particularly to a thin film transistor and a method of fabricating the same, an array substrate and a display device.

BACKGROUND

In recent years, the application of augmented reality (AR) and virtual reality (VR) technologies in the display field has been developed rapidly, and becomes a hot topic in application and research. AR technology is a technology for calculating a position and an angle of a camera image in real time and combining corresponding images, videos and 3D models together, and its goal is to superimpose images of the virtual world on images of the real world on a screen and make interaction between the virtual world and the real world. VR technology is a technology for presenting virtual scenes rendered by a computer to the user by virtue of computer graphics technology and stereoscopic display technology and providing a user-friendly interaction mode between the virtual world and the real world, thereby providing the user with an immersive virtual reality experience. With the development of AR and VR technologies, requirements for liquid crystal displays have gradually increased.

However, current thin film transistors, array substrates, and display devices still need to be improved.

SUMMARY

In an aspect, the present disclosure provides a thin film transistor, which includes: a substrate; a first source/drain electrode on the substrate; an active layer at a side of the first source/drain electrode facing away from the substrate; and a second source/drain electrode at a side of the active layer facing away from the first source/drain electrode. The first source/drain electrode and the second source/drain electrode are electrically connected to the active layer independently.

In some embodiments, an orthographic projection of the first source/drain electrode on the substrate at least partially overlaps with an orthographic projection of the second source/drain electrode on the substrate.

In some embodiments, an orthographic projection of the active layer on the substrate has a rectangular shape.

In some embodiments, the orthographic projection of the first source/drain electrode on the substrate covers the orthographic projection of the active layer on the substrate.

In some embodiments, the orthographic projection of the second source/drain electrode on the substrate partially overlaps with the orthographic projection of the first source/drain electrode on the substrate.

In some embodiments, the thin film transistor further includes at least one of: a buffer layer between the first source/drain electrode and the active layer and having a first via penetrating the buffer layer, the active layer being electrically connected to the first source/drain electrode through the first via; and an interlayer dielectric layer between the active layer and the second source/drain electrode and having a second via penetrating the interlayer dielectric layer, the active layer being electrically connected to the second source/drain electrode through the second via.

In some embodiments, in a case where the thin film transistor includes the buffer layer and the interlayer dielectric layer, an orthographic projection of the first via on the substrate and an orthographic projection of the second via on the substrate do not overlap with each other.

In some embodiments, the thin film transistor further includes a gate electrode at a side of the active layer facing away from the first source/drain electrode and at a side of the second source/drain electrode facing the active layer.

In some embodiments, the thin film transistor further includes a gate insulating layer at a side of the active layer facing away from the first source/drain electrode and at a side of the gate electrode facing the active layer.

In some embodiments, the first source/drain electrode is configured to not allow light to pass therethrough.

In another aspect, the present disclosure provides an array substrate including the above thin film transistor.

In some embodiments, the thin film transistor further includes a gate electrode at a side of the active layer facing away from the first source/drain electrode, and the second source/drain electrode is at a side of the gate electrode facing away from the active layer. The array substrate further includes a pixel electrode at a side of the second source/drain electrode facing away from the gate electrode and electrically connected to the second source/drain electrode. An orthographic projection of the first source/drain electrode on the substrate covers an orthographic projection of the active layer on the substrate, and an orthographic projection of the second source/drain electrode on the substrate partially overlaps with the orthographic projection of the first source/drain electrode on the substrate.

In some embodiments, the thin film transistor further includes at least one of: a buffer layer at a side of the first source/drain electrode facing away from the substrate and having a first via penetrating the buffer layer; and an interlayer dielectric layer at a side of the gate electrode facing away from the active layer and having a second via penetrating the interlayer dielectric layer. The array substrate further includes: a first passivation layer at a side of the second source/drain electrode facing away from the interlayer dielectric layer; a common electrode at a side of the first passivation layer facing away from the second source/drain electrode; and a second passivation layer between the common electrode and the pixel electrode.

In another aspect, the present disclosure provides a display device including the above array substrate.

In another aspect, the present disclosure provides a method of fabricating a thin film transistor, including: providing a substrate; forming a first source/drain electrode on the substrate; forming an active layer at a side of the first source/drain electrode facing away from the substrate; and forming a second source/drain electrode at a side of the active layer facing away from the first source/drain electrode. The first source/drain electrode and the second source/drain electrode are formed to be electrically connected to the active layer independently.

BRIEF DESCRIPTION OF DRAWINGS

The above and/or additional aspects and advantages of the present disclosure will become apparent and readily understood from the description of the embodiments in conjunction with the drawings, in which.

DETAILED DESCRIPTION

Figure 1:
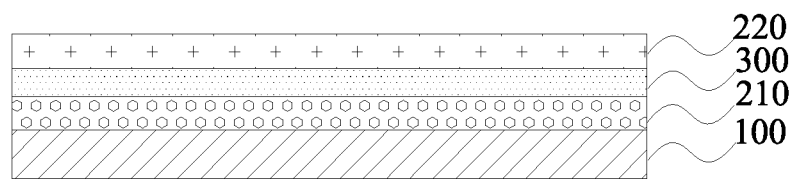
FIG. 1 is a cross-sectional view illustrating partial structures of a thin film transistor according to an embodiment of the present disclosure.

Embodiments of the present disclosure are described in detail below, and examples of the embodiments are illustrated in the drawings, in which the same or similar reference numerals are used to refer to the same or similar elements or elements having the same or similar functions. The embodiments described below with reference to the accompanying drawings are illustrative for explaining the present disclosure only, and are not to be construed as limiting the present disclosure.

Current display devices generally have problems of large area occupied by a thin film transistor, low aperture ratio, low resolution and the like. This is mainly because in the thin film transistor of the current display device, an active layer is usually designed to be U-shaped or L-shaped and the source/drain electrodes are designed to be spaced apart from each other in one layer of metal structure, whereas the margin between the source/drain electrodes spaced apart from each other is insufficient. This will cause defects in the product and affect the yield. Therefore, in a case where it is desired to increase the resolution of the display device, the existing thin film transistor has a large occupied area resulting in a low aperture ratio, so the resolution cannot be improved, thereby not satisfying the gradually-developing requirements for the high resolution of the display device, particularly the requirement of AR and VR technologies for the high resolution of the display device. With the application of AR and VR technologies in the display field, a high-resolution display device has become a development trend, and plays a vital role in the user experience. As a result, the display device is developed toward a high-resolution direction, and its pixels are getting smaller and smaller and its requirements for a circuit structure of a thin film transistor are getting higher and higher. Therefore, there is a need for a thin film transistor having a small occupied area, which, when applied to a display device, will greatly increase the aperture ratio and resolution of the display device and improve the display effect and the user experience.

Accordingly, the present disclosure provides, inter alia, a thin film transistor, an array substrate, a display device, and a method of fabricating a thin film transistor, which substantially obviate one or more of the problems due to limitations and disadvantages of the related art.

In an aspect, embodiments of the present disclosure provide a thin film transistor. According to some embodiments of the present disclosure, referring to FIG. 1, the thin film transistor includes a substrate 100, a first source/drain electrode 210, an active layer 300, and a second source/drain electrode 220. According to some embodiments of the present disclosure, the first source/drain electrode 210 is disposed on the substrate 100, the active layer 300 is disposed at a side of the first source/drain electrode 210 facing away from the substrate 100, and the second source/drain electrode 220 is disposed at a side of the active layer 300 facing away from the first source/drain electrode 210. The first source/drain electrode 210 and the second source/drain electrode 220 are electrically connected to the active layer 300 independently. According to the embodiments of the present disclosure, the first source/drain electrode 210 may be one of a source electrode and a drain electrode, and the second source/drain electrode 220 may be the other of the source electrode and the drain electrode. Accordingly, in the thin film transistor, it is not necessary to leave a lateral distance between the source electrode and the drain electrode, thereby reducing the distance margin. The thin film transistor has at least one of the advantages of a small occupied area, a reduced area of the opaque portion, an improved product yield, and facilitation of fabricating a display device having a small pixel size, a large aperture ratio, and a high resolution.

Figure 2:
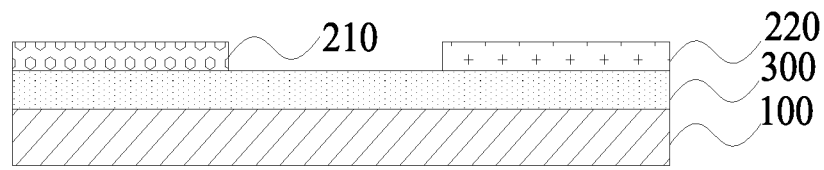
FIG. 2 is a cross-sectional view illustrating partial structures of a thin film transistor in the related art.

For ease of understanding, the principle of increasing the aperture ratio when the thin film transistor according to an embodiment of the present disclosure is employed in a display device will be briefly described below. Referring to FIG. 2 (which is a schematic diagram illustrating partial structures of a thin film transistor in the related art), source and drain electrodes (210 and 220 as illustrated in the drawing) in the existing thin film transistor are generally arranged in a same layer. When the resolution needs to be gradually increased, this thin film transistor occupies a large area, and thus, fabrication of a display device having a high resolution cannot be achieved. In addition, as mentioned above, in order to ensure the yield, a sufficiently wide gap needs to be provided between the source and drain electrodes arranged in the same layer, thereby further increasing the area occupied by the source and drain electrodes. However, in the embodiments of the present disclosure, the first source/drain electrode 210 and the second source/drain electrode 220 are arranged in different layers, so the gap between the source and drain electrodes can be omitted, as compared to the source and drain electrodes arranged in the same layer in the thin film transistor of the related art. Further, in some embodiments, the source and drain electrodes may be arranged to overlap in a vertical direction (i.e., an orthographic projection of the source electrode on the substrate at least partially overlaps with an orthographic projection of the drain electrode on the substrate), thereby reducing the area of the opaque portion (for example, the source electrode and/or the drain electrode) of the thin film transistor, and in turn reducing the area of the thin film transistor occupied in the display device. Therefore, the light transmissive area of the pixel portion is increased accordingly, and the aperture ratio of the display device is increased. On this basis, by providing a more proper pixel structure, the pixel size can be further reduced. Thus, a display device of higher resolution can be fabricated, thereby satisfying the requirements of the AR and VR technologies for the high resolution of the display device. Moreover, the first source/drain electrode 210 and the second source/drain electrode 220 arranged in different layers can avoid insufficient margin between the source and drain electrodes, thereby reducing product defects and improving product yield.

Hereinafter, various portions of the thin film transistor will be described in detail in accordance with specific embodiments of the present disclosure.

According to the embodiments of the present disclosure, the specific materials for forming the substrate 100, the first source/drain electrode 210, the active layer 300, and the second source/drain electrode 220 are not particularly limited, and those skilled in the art can select the materials according to actual needs. In some embodiments, the active layer 300 may be formed of polysilicon (e.g., low temperature polysilicon).

Figure 3:
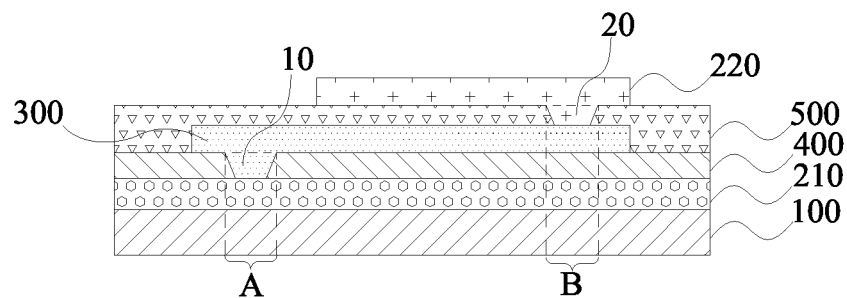
FIG. 3 is a cross-sectional view illustrating a structure of a thin film transistor according to an embodiment of the present disclosure.

According to an embodiment of the present disclosure, referring to FIG. 3, the thin film transistor further includes at least one of a buffer layer 400 and an interlayer dielectric layer 500. In some embodiments, the buffer layer 400 is disposed between the first source/drain electrode 210 and the active layer 300 and has a first via 10 penetrating the buffer layer, and the active layer 300 is electrically connected to the first source/drain electrode 210 through the first via 10. For example, a portion of the active layer 300 fills the first via 10 to be in contact with and electrically connected to the first source/drain electrode 210. In some embodiments, the interlayer dielectric layer 500 is disposed between the active layer 300 and the second source/drain electrode 200 and has a second via 20 penetrating the interlayer dielectric layer, and the active layer 300 is electrically connected to the second source/drain electrode 220 through the second via 20. For example, a portion of the second source/drain electrode 220 fills the second via 20 to be in contact with and electrically connected to the active layer 300. As such, the first source/drain electrode 210 and the second source/drain electrode 220 can be electrically connected to the active layer 300 independently through the vias, thereby further improving the performance of the thin film transistor. In some embodiments, an orthographic projection (e.g., the region A as shown in FIG. 3) of the first via 10 on the substrate 100 and an orthographic projection (e.g., the region B as shown in FIG. 3) of the second via 20 on the substrate 100 do not overlap with each other such that the first source/drain electrode 210 and the second source/drain electrode 220 are electrically connected to the active layer 300 independently. According to the embodiments of the present disclosure, the specific manner of forming the first via 10 and the second via 20 is not particularly limited, and those skilled in the art can select the forming manner according to actual needs. For example, in some embodiments, the first via 10 and the second via 20 may be formed by etching.

Figure 4:
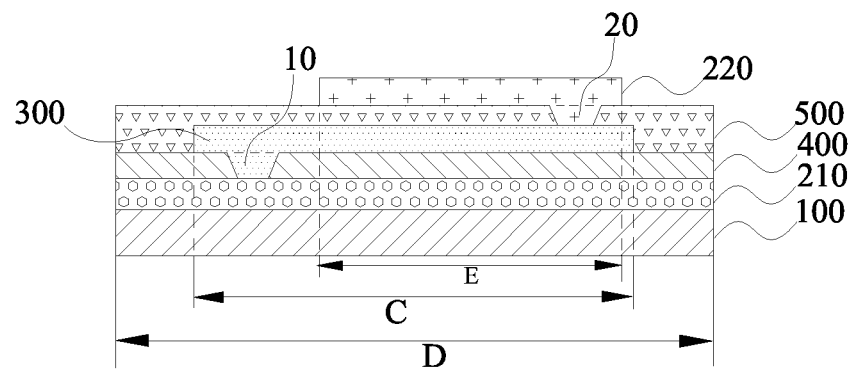
FIG. 4 is a cross-sectional view illustrating a structure of a thin film transistor according to an embodiment of the present disclosure.
Figure 10:
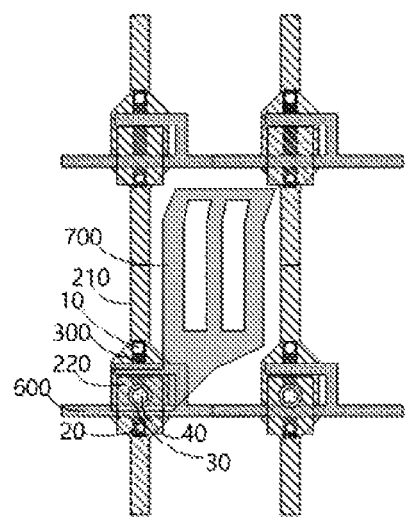
FIG. 10 is a plan view illustrating partial processes for fabricating an array substrate according to an embodiment of the present disclosure.

In some embodiments, referring to FIGS. 4 and 10, an orthographic projection (e.g., the region C as shown in FIG. 4) of the active layer 300 on the substrate 100 has a rectangular shape. As such, the performance of the thin film transistor can be further improved. For example, an area of the active layer 300 (whose orthographic projection on the substrate 100 has a rectangular shape) is reduced as compared to the L-shaped or U-shaped active layer in the related art, which further reduces the area of the opaque portion of the thin film transistor. In some embodiments, an orthographic projection of the active layer 300 on the substrate 100 is within the orthographic projection (e.g., the region D as shown in FIG. 4) of the first source/drain electrode 210 on the substrate 100, that is, the orthographic projection of the first source/drain electrode 210 on the substrate 100 covers the orthographic projection of the active layer 300 on the substrate 100. As such, the first source/drain electrode 210 can have a function of light shielding, which can prevent the active layer 300 from generating a photocurrent under the illumination of the backlight and thus prevent leakage, and can further reduce the area of the opaque portion of the thin film transistor. In some embodiments, the orthographic projection (e.g., the region E as shown in FIG. 4) of the second source/drain electrode 220 on the substrate 100 partially overlaps with the orthographic projection of the first source/drain electrode 210 on the substrate 100. As such, the area of the opaque portion can be reduced, and the occupied area of the thin film transistor can be further reduced, which is advantageous for fabricating a display device having a small pixel size, a large aperture ratio, and a high resolution.

According to the embodiments of the present disclosure, the specific materials and structures of the buffer layer 400 and the interlayer dielectric layer 500 are not particularly limited, and those skilled in the art can select the materials and structures according to actual needs. In some embodiments, the buffer layer 400 may include a first buffer layer (not shown in the drawings) and a second buffer layer (not shown in the drawings). In some embodiments, the interlayer dielectric layer 500 may include a first interlayer dielectric layer (not shown in the drawings) and a second interlayer dielectric layer (not shown in the drawings). Needless to say, the buffer layer and the interlayer dielectric layer according to the embodiments of the present disclosure are not limited thereto, and they may each be implemented as a single layer.

Figure 6:
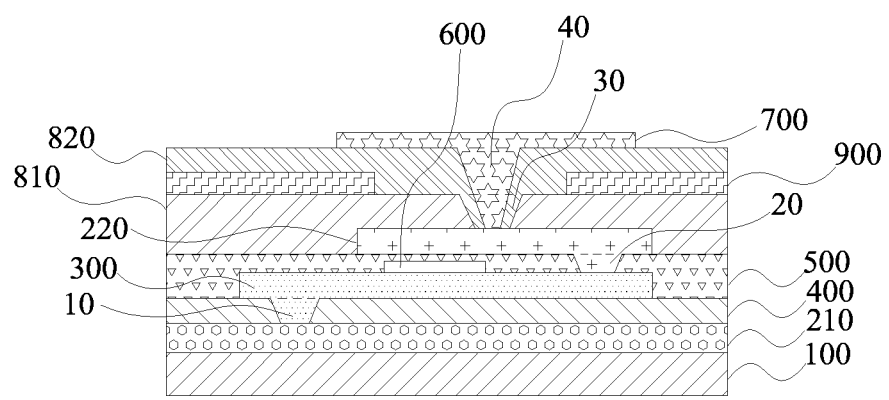
FIG. 6 is a cross-sectional view illustrating a structure of an array substrate according to an embodiment of the present disclosure.
Figure 7:
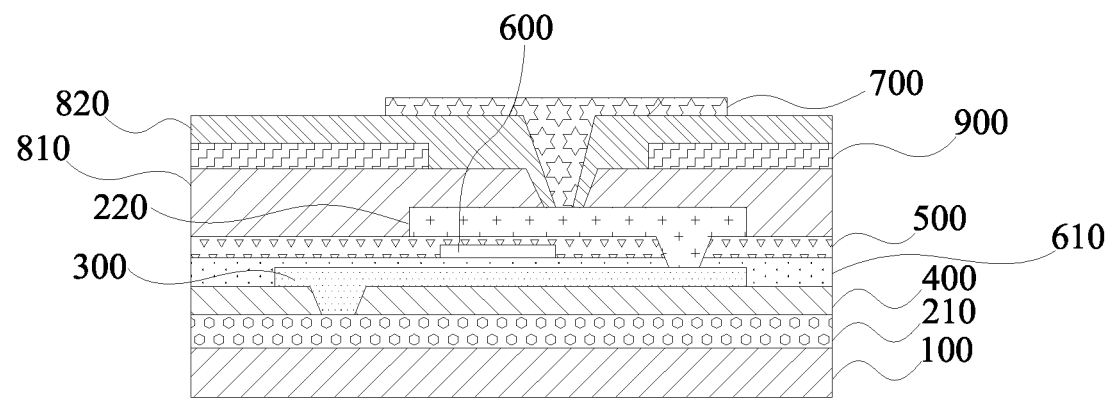
FIG. 7 is a cross-sectional view illustrating a structure of an array substrate according to an embodiment of the present disclosure.

In some embodiments, the thin film transistor further includes a gate electrode (e.g., a gate electrode 600 in FIGS. 6, 7, and 10). According to the embodiments of the present disclosure, the specific position where the gate electrode is provided is not particularly limited, and those skilled in the art can select the position according to actual needs. For example, referring to FIGS. 6 and 7, the gate electrode may be disposed between the active layer 300 and the second source/drain electrode 220, that is, disposed at a side of the active layer 300 facing away from the first source/drain electrode 210 and at a side of the second source/drain electrode 220 facing the active layer 300. In some embodiments, the thin film transistor further includes a gate insulating layer (e.g., a gate insulating layer 610 in FIG. 7) that may be disposed between the active layer 300 and the gate electrode. For example, referring to FIG. 7, the gate insulating layer 610 is disposed at a side of the active layer 300 facing away from the first source/drain electrode 210 and at a side of the gate electrode 600 facing the active layer 300. In some embodiments, the gate insulating layer further includes a first gate insulating layer (not shown in the drawings) and a second gate insulating layer (not shown in the drawings). According to the embodiment of the present disclosure, the specific materials for forming the gate electrode and the gate insulating layer are not particularly limited, and those skilled in the art can select the materials according to actual needs.

In another aspect, the embodiments of the present disclosure provide an array substrate. According to the embodiments of the present disclosure, the array substrate includes the thin film transistor described above. As such, the array substrate may have all of the features and advantages of the thin film transistor described above, which will not be described herein. According to the embodiments of the present disclosure, the specific type of the thin film transistor in the array substrate is not particularly limited, and those skilled in the art can select the type according to actual needs. For example, in some embodiments, the thin film transistor may be of a bottom gate type or a top gate type. In some embodiments, the array substrate further includes a pixel electrode and a common electrode. According to the embodiments of the present disclosure, the specific materials for forming the pixel electrode and the common electrode and the specific positions where the pixel electrode and the common electrode are provided are not particularly limited, and those skilled in the art can select the materials and positions according to actual needs. In summary, the array substrate has at least one of the advantages of a small occupied area of a thin film transistor, a reduced area of the opaque portion, an improved product yield, and facilitation of fabricating a display device having a small pixel size, a large aperture ratio, and a high resolution.

In another aspect, the embodiments of the present disclosure provide an array substrate. The array substrate may be the array substrate described above, and thus may have all of the features and advantages of the array substrate described above, which will not be described herein. According to the embodiments of the present disclosure, the specific position where the gate electrode is provided in the array substrate is not particularly limited, and those skilled in the art can select the position according to actual needs. Hereinafter, a detailed description will be given by taking a case where the gate electrode is disposed between the active layer and the second source/drain electrode as an example.

Figure 5:
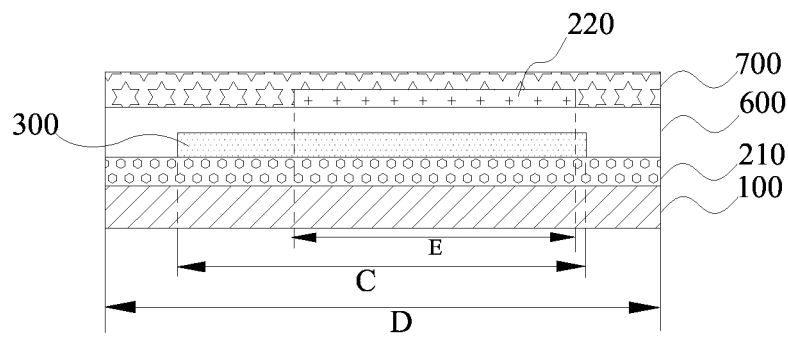
FIG. 5 is a cross-sectional view illustrating partial structures of an array substrate according to an embodiment of the present disclosure.

In some embodiments, referring to FIG. 5, the array substrate includes a substrate 100, a first source/drain electrode 210, an active layer 300, a gate electrode 600, a second source/drain electrode 220, and a pixel electrode 700. In some embodiments, the first source/drain electrode 210 is disposed on the substrate 100. In some embodiments, the active layer 300 is disposed at a side of the first source/drain electrode 210 facing away from the substrate 100. In some embodiments, the gate electrode 600 is disposed at a side of the active layer 300 facing away from the first source/drain electrode 210. In some embodiments, the second source/drain electrode 220 is disposed at a side of the gate electrode 600 facing away from the active layer 300. In some embodiments, the pixel electrode 700 is disposed at a side of the second source/drain electrode 220 facing away from the gate electrode 600, and the pixel electrode 700 is electrically connected to the second source/drain electrode 220. In some embodiments, the first source/drain electrode 210 and the second source/drain electrode 220 are electrically connected to the active layer 300 independently, and an orthographic protection (e.g., the region C as shown in FIG. 5) of the active layer 300 on the substrate 100 is within an orthographic projection (e.g., the region D as shown in FIG. 5) of the first source/drain electrode 210 on the substrate 100, and an orthographic projection (e.g., the region E as shown in FIG. 5) of the second source/drain electrode 220 on the substrate 100 partially overlaps with the orthographic projection of the first source/drain electrode 210 on the substrate 100. The array substrate may be the array substrate described above, and thus may have all the features and advantages of the array substrate described above, which will not be described herein. In summary, the array substrate has at least one of the advantages of a small occupied area of a thin film transistor, a reduced area of the opaque portion, an improved product yield, and facilitation of fabricating a display device having a small pixel size, a large aperture ratio, and a high resolution.

In some embodiments, referring to FIG. 6, the array substrate further includes at least one of a buffer layer 400, an interlayer dielectric layer 500, a first passivation layer 810, a common electrode 900, and a second passivation layer 820. In some embodiments, the buffer layer 400 is disposed at a side of the first source/drain electrode 210 facing away from the substrate 100, and has a first via 10 penetrating the buffer layer 400. In some embodiments, the interlayer dielectric layer 500 is disposed at a side of the gate electrode 600 facing away from the active layer 300, and has a second via 20 penetrating the interlayer dielectric layer 500. In some embodiments, the first passivation layer 810 is disposed at a side of the second source/drain electrode 220 facing away from the interlayer dielectric layer 500. In some embodiments, the common electrode 900 is disposed at a side of the first passivation layer 810 facing away from the second source/drain electrode 220. In some embodiments, the second passivation layer 820 is disposed between the common electrode 900 and the pixel electrode 700. As such, the first source/drain electrode 210 and the second source/drain electrode 220 can be electrically connected to the active layer 300 independently through the vias, thereby further improving the performance of the thin film transistor. In some embodiments, the first passivation layer 810 may have a third via 30, the second passivation layer 820 may have a fourth via 40, and the third via 30 and the fourth via 40 constitute a nested structure in which the fourth via 40 extends into the third via 30 and the portion of the fourth via 40 extending into the third via 30 is surrounded by the third via, so the pixel electrode 700 can be electrically connected to the second source/drain electrode 220 through the nested structure. According to the embodiments of the present disclosure, the specific manner of forming the third via 30 and the fourth via 40 is not particularly limited, and those skilled in the art can select the manner of forming the vias according to actual needs. For example, in some embodiments, the third via 30 and the fourth via 40 may be formed by etching.

In some embodiments, referring to FIG. 7, the array substrate further includes a gate insulating layer 610. In some embodiments, the gate insulating layer 610 may be disposed between the active layer 300 and the gate electrode 600. In some embodiments, the gate insulating layer 610 may include a first gate insulating layer (not shown in the drawings) and a second gate insulating layer (not shown in the drawings). Needless to say, the gate insulating layer according to the embodiments of the present disclosure is not limited thereto, and it may be implemented as a single layer. According to the embodiments of the present disclosure, the specific material for forming the gate insulating layer 610 is not particularly limited, and those skilled in the art can select the material according to actual needs.

Figure 8:
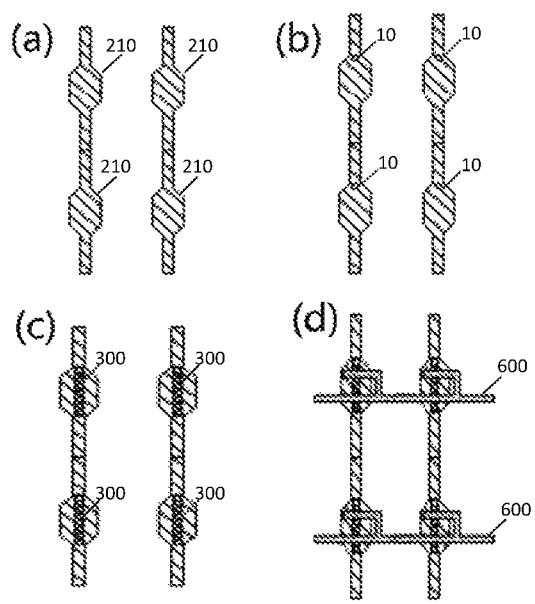
FIG. 8 is a plan view illustrating partial processes for fabricating an array substrate according to an embodiment of the present disclosure.
Figure 9:
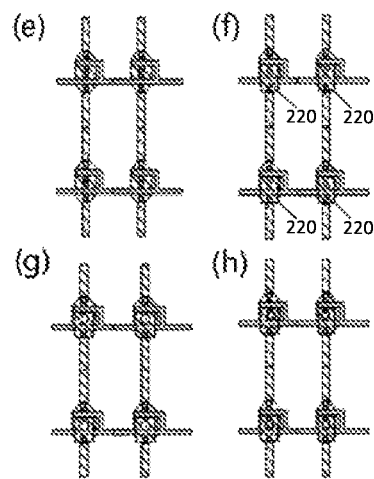
FIG. 9 is a plan view illustrating partial processes for fabricating an array substrate according to an embodiment of the present disclosure.

According to the embodiments of the present disclosure, the specific manner of fabricating the above array substrate is not particularly limited, and those skilled in the art can select the manner of fabricating the array substrate according to actual needs. For example, according to an embodiment of the present disclosure, referring to FIGS. 8 to 10, the above array substrate can be fabricated by the following method. First, referring to (a) of FIG. 8, a first source/drain electrode 210 (for example, it may be a source electrode, and may be formed of Ti/Al/Ti or Mo/Al/Mo) is formed on a substrate, and the first source/drain electrode can function to block the backlight and prevent the active layer from leaking current under the illumination of the backlight. Referring to (b) of FIG. 8, a buffer layer (for example, it may be formed of SiO/SiNx) is formed, and then a first via 10 is formed by punching the buffer layer. Then, referring to (c) of FIG. 8, an active layer 300 (for example, it may be formed of low-temperature polysilicon) may be formed, and one end of the active layer 300 of a rectangular strip shape is connected to the first source/drain electrode 210 through the first via. Subsequently, referring to (d) of FIG. 8, a gate insulating layer and a gate electrode 600 are formed. Referring to (e) of FIG. 9, after an interlayer dielectric layer is formed, the interlayer dielectric layer is punched to form a second via. Thereafter, referring to (f) of FIG. 9, a second source/drain electrode 220 (e.g., it may be a drain electrode) is formed, which may be made of the same material as that of the first source/drain electrode and is connected to the other end of the active layer through the second via. Referring to (g) of FIG. 9, after the first passivation layer is formed, the first passivation layer is punched to form a third via, and then, referring to (h) of FIG. 9, after the second passivation layer is formed, the second passivation layer is punctured to form a fourth via. Finally, referring to FIG. 10, the pixel electrode 700 is connected to the second source/drain electrode 220 through the third via 30 and the fourth via 40 to form a signal conduction path. The first source/drain electrode 210 and the second source/drain electrode 220 are disposed in different layers, and the orthographic projection of the active layer 300 on the substrate 100 is within the orthographic projection of the first source/drain electrode 210 on the substrate 100. The first source/drain electrode 210 can have a function of light shielding to prevent leakage of the active layer, and can further reduce the area of the opaque portion of the thin film transistor. The orthographic projection of the second source/drain electrode 220 on the substrate 100 at least partially overlaps with the orthographic projection of the first source/drain electrode 210 on the substrate 100, so that the area of the opaque portion can be reduced, the area occupied by the array substrate in the display device is reduced, the aperture ratio of the display device is increased, and a display device having a higher resolution is fabricated, which satisfies the requirements of the AR and VR technologies for the high resolution of the display device. Moreover, disposing the first source/drain electrode 210 and the second source/drain electrode 220 in different layers can avoid insufficient margin between the source and drain electrodes, thereby reducing product defects and improving product yield.

Figure 11:
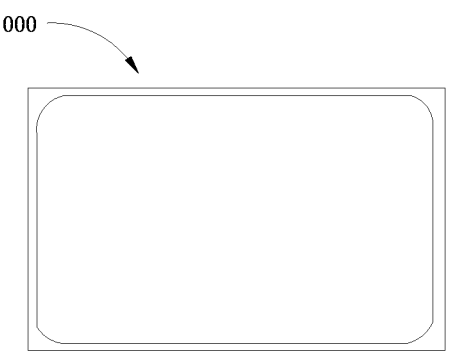
FIG. 11 is a plan view illustrating a structure of a display device according to an embodiment of the present disclosure.

In yet another aspect, the embodiments of the present disclosure provide a display device. According to an embodiment of the present disclosure, referring to FIG. 11, the display device 1000 includes the array substrate described above. As such, the display device can have all the features and advantages of the array substrate described above, which are not described in detail herein. In summary, the display device has at least one of the advantages of a small occupied area of a thin film transistor, a reduced area of the opaque portion, an improved product yield, a small pixel size, a large aperture ratio, and a high resolution, thereby satisfying the requirements of AR and VR technologies for the high resolution of the display device. In other words, in the display device, the first source/drain electrode and the second source/drain electrode are disposed in different layers, the orthographic projection of the active layer on the substrate has a rectangular shape and is within the orthographic projection of the first source/drain electrode on the substrate, and the orthographic projection of the second source/drain electrode on the substrate at least partially overlaps with the orthographic projection of the first source/drain electrode on the substrate, resulting in a reduced area of the opaque portion, an improved product yield, and a reduced pixel size, an increased aperture ratio, and an improved resolution of the display device, which satisfies the requirements of AR and VR technologies for the high resolution of the display device.

In the description of the present disclosure, the orientational or positional relationship indicated by the term "upper", "lower" or the like is based on the orientational or positional relationship shown in the drawings, for the convenience of describing the present disclosure without requiring the present disclosure to be constructed and operated in a specific orientation, and therefore cannot to be construed as limiting the present disclosure.

In the description of the present specification, the description with reference to the terms "an embodiment", "another embodiment" or the like means that the specific features, structures, materials or characteristics described in connection with the embodiment are included in at least one embodiment of the present disclosure. In the present specification, an illustrative description with reference to the above terms is not necessarily directed to the same embodiment or example. Also, the specific features, structures, materials, or characteristics described may be combined in a suitable manner in any one or more embodiments or examples. Furthermore, various embodiments or examples described in the specification, as well as features of various embodiments or examples, may be integrated and combined without confliction. In addition, it should be noted that in the present specification, the terms such as "first" and "second" are used for descriptive purposes only, and are not to be construed as indicating or implying a relative importance or implicitly indicating the number of technical features.

While the embodiments of the present disclosure have been shown and described above, it can be understood that the foregoing embodiments are merely illustrative and not to be construed as limiting the scope of the present disclosure. Those of ordinary skill in the art may make various changes, modifications, substitutions and variations to the foregoing embodiments within the scope of the present disclosure.

What is claimed is:

1. A thin film transistor, comprising: a substrate;
   a first source/drain electrode on the substrate;
   an active layer at a side of the first source/drain electrode facing away from the substrate;
   a second source/drain electrode at a side of the active layer facing away from the first source/drain electrode;
   a buffer layer between the first source/drain electrode and the active layer and having a first via penetrating the buffer layer, the active layer being electrically connected to the first source/drain electrode through the first via; and
   an interlayer dielectric layer between the active layer and the second source/drain electrode and having a second via penetrating the interlayer dielectric layer, the active layer being electrically connected to the second source/drain electrode through the second via,
   wherein the first source/drain electrode and the second source/drain electrode are electrically connected to the active layer independently, and an orthographic projection of the first via on the substrate and an orthographic projection of the second via on the substrate do not overlap with each other; and wherein an orthographic projection of the first source/drain electrode on the substrate covers an orthographic projection of the active layer on the substrate and an orthographic projection of the second source/drain electrode on the substrate.

2. The thin film transistor of claim 1, wherein an orthographic projection of the first source/drain electrode on the substrate at least partially overlaps with an orthographic projection of the second source/drain electrode on the substrate.

3. The thin film transistor of claim 1, wherein an orthographic projection of the active layer on the substrate has a rectangular shape.

4. The thin film transistor of claim 1, wherein an orthographic projection of the second source/drain electrode on the substrate partially overlaps with an orthographic projection of the first source/drain electrode on the substrate.

5. The thin film transistor of claim 1, further comprising:
a gate electrode at a side of the active layer facing away from the first source/drain electrode and at a side of the second source/drain electrode facing the active layer.

6. The thin film transistor of claim 5, further comprising:
a gate insulating layer at a side of the active layer facing away from the first source/drain electrode and at a side of the gate electrode facing the active layer.

7. The thin film transistor of claim 1, wherein the first source/drain electrode is configured to not allow light to pass therethrough.

8. An array substrate, comprising the thin film transistor of claim 1.

9. The array substrate of claim 8, wherein the thin film transistor further comprises a gate electrode at a side of the active layer facing away from the first source/drain electrode, and the second source/drain electrode is at a side of the gate electrode facing away from the active layer, wherein the array substrate further comprises a pixel electrode at a side of the second source/drain electrode facing away from the gate electrode and electrically connected to the second source/drain electrode, and wherein an orthographic projection of the first source/drain electrode on the substrate covers an orthographic projection of the active layer on the substrate, and an orthographic projection of the second source/drain electrode on the substrate partially overlaps with the orthographic projection of the first source/drain electrode on the substrate.

10. The array substrate of claim 9, wherein the thin film transistor further comprises at least one of:

a buffer layer at a side of the first source/drain electrode facing away from the substrate and having a first via penetrating the buffer layer, and an interlayer dielectric layer at a side of the gate electrode facing away from the active layer and having a second via penetrating the interlayer dielectric layer, and the array substrate further comprises:
a first passivation layer at a side of the second source/drain electrode facing away from the interlayer dielectric layer,
a common electrode at a side of the first passivation layer facing away from the second source/drain electrode, and
a second passivation layer between the common electrode and the pixel electrode.

11. A display device, comprising the array substrate of claim 8.

12. A method of fabricating a thin film transistor, comprising:
providing a substrate;
forming a first source/drain electrode on the substrate;
forming an active layer at a side of the first source/drain electrode facing away from the substrate; and
forming a second source/drain electrode at a side of the active layer facing away from the first source/drain electrode,
wherein the first source/drain electrode and the second source/drain electrode are formed to be electrically connected to the active layer independently,
the method further comprises:
forming a buffer layer between the first source/drain electrode and the active layer and having a first via penetrating the buffer layer, the active layer being electrically connected to the first source/drain electrode through the first via; and
forming an interlayer dielectric layer between the active layer and the second source/drain electrode and having a second via penetrating the interlayer dielectric layer, the active layer being electrically connected to the second source/drain electrode through the second via, and
wherein an orthographic projection of the first via on the substrate and an orthographic projection of the second via on the substrate do not overlap with each other; and
wherein an orthographic projection of the first source/drain electrode on the substrate covers an orthographic projection of the active layer on the substrate and an orthographic projection of the second source/drain electrode on the substrate.

\* \* \* \* \*